United States Patent [19]

Volluet

[11] 4,209,759
[45] Jun. 24, 1980

[54] MAGNETOELASTIC SURFACE WAVE INTERACTION DEVICE

[75] Inventor: Gérard Volluet, Paris, France

[73] Assignee: Thomson-CSF, Paris, France

[21] Appl. No.: 952,955

[22] Filed: Oct. 20, 1978

[30] Foreign Application Priority Data

Oct. 25, 1977 [FR] France .................................. 77 32054

[51] Int. Cl.² ........................ H03H 9/26; H03H 9/30; H03H 9/04
[52] U.S. Cl. ......................................... 333/153; 310/26; 310/313; 333/154; 364/821; 364/823
[58] Field of Search ................................ 333/148–155, 333/193–196; 364/819–824; 310/313, 26; 330/5.5, 4.8, 4.6; 332/51 R, 51 H, 51 W, 29 R

[56] References Cited

U.S. PATENT DOCUMENTS

| 3,353,118 | 11/1967 | Olson et al. ........................ 332/29 R |
| 4,078,186 | 3/1978 | Folen et al. ....................... 333/152 X |

FOREIGN PATENT DOCUMENTS

| 1364894 | 8/1974 | United Kingdom ..................... 333/148 |
| 1439820 | 6/1976 | United Kingdom . |
| 1481591 | 8/1977 | United Kingdom . |

OTHER PUBLICATIONS

Lagasse et al.–"Acoustic Surface Waveguides–Analysis and Assessment", Proc. on Microwave Theory and Techniques, vol. MTT21, No. 4, Apr. 1973; pp. 225–236.
Oliner–"Waveguides for Acoustic Surface Waves: A Review", Proc. of the IEEE, vol. 64, No. 5, May 1976; pp. 615–627.
Khuri-Yakub et al., "Monolithic Waveguide Zinc-Oxide-on-Silicon Convolver", Electronics Letters, 27 May 1975, vol. 12, No. 11; pp. 271–272.
Penunuri–"Surface Acoustic Wave Velocities of Isotropic Metal Films on Selected Cuts of $Bi_{12}GeO_{20}$, Quartz, $Al_2O_3$, and $LiNbO_3$", IEEE Trans on Sonics and Ultrasonics, vol. SU21, No. 4, Oct. 1974; pp. 293–295.
Ganguly et al.–"The Magnetic Control of Surface Elastic Waves in a Novel Layered Structure", AIP Conference Proceedings, No. 34, 1976; pp. 259–261.
Luukkala et al.–"Convolution and Time Inversion Using Parametric Interactions of Acoustic Surface Waves", in Applied Physics Letters, vol. 18, No. 9, 1 May 1971; pp. 393–394.

Primary Examiner—Marvin L. Nussbaum
Attorney, Agent, or Firm—Cushman, Darby & Cushman

[57] ABSTRACT

The invention relates to an interaction device comprising a non-magnetic substrate, a thin easy-plane magnetic layer, two piezoelectric transducers arranged at the ends of the magnetic layer and respectively receiving the two electrical signals to be treated. The signals applied are converted into elastic surface waves which are transmitted to the magnetic layer in the form of magnetoelastic waves propagated in opposite directions. The device is subjected to an external magnetic field. The variations in magnetization in the interaction zone are collected by a detection plate and characterize the interaction between the two signals.

11 Claims, 3 Drawing Figures

MAGNETOELASTIC SURFACE WAVE INTERACTION DEVICE

This invention relates to magnetoelastic surface wave devices which utilize the magnetoelastic effects for the interaction of two incident waves, for example with a view to obtain their product of convolution.

In order to obtain the product of convolution of two signals, it is necessary first of all to delay the signals in order to make them interact to form the product, the resulting signal being collected in a region corresponding to the interaction zone.

One method to delay two signals and to form their product consists in using a piezoelectric substrate excited at its two ends by transducers which transform the electrical signals to be treated into elastic waves which are propagated in the material. If the medium is non-linear, the interaction of the two waves propagated in opposite directions produces an electrical field which may be detected by means of a receiving transducer. It is possible to use a substrate of lithium niobate for devices of this type. However, the effects obtained are fairly weak and the corresponding merit factor is unsatisfactory.

Where the piezoelectric medium induces only weak non-linear effects, device of the same type have provided additional means for creating the non-linearities: semiconductor elements have been arranged in the vicinity of the extraction points for the delayed elastic waves, the interaction taking place in the semiconductor elements.

Another method has been used for making two signals interact. This method uses the magnetostrictive effects in solid magnetic materials. Piezoelectric elements excited by transducers generate elastic waves which are propagated in the magnetic material where the non linear interaction takes place. This interaction is controlled by an external magnetic field, the magnetic field inside the material being spatially non-uniform in the direction of propagation of the acoustic waves due to the magnitude of the demagnetizing fields in solid materials of the type in question. Accordingly, the magnetoelastic interaction, which for waves of given frequency only occurs for a given magnetic field, takes place over only a limited length.

The present invention relates to a magnetoelastic surface wave interaction device of the type utilizing magnetostrictive effects which does not have any of the disadvantages referred to above.

In particular, the interaction device according to the present invention is such that elastic waves corresponding to the two signals to be treated are propagated in a thin-layer ferrimagnetic garnet doped in such a way that the useful length of the substrate is substantially increased in relation to conventional devices. This is because, in a structure of the type in question, the demagnetizing effects decrease when the magnetic field is applied in the plane of the thin layer.

According to the invention, there is provided a magnetoelastic surface wave interaction device between first and second electrical signals to be treated simultaneously, comprising a non-magnetic substrate covered with a magnetic layer having two ends, this layer being magnetically polarized, two emission transducers having respective inputs to receive said first and second signals, said transducers being arranged on said two ends for exciting said magnetic layer, each being intended to emit a magnetoelastic surface wave, said waves being contrapropagated along a common direction in the magnetic layer, and at least one detection transducer intended to detect variations in magnetic field in the vicinity of the surface of said magnetic layer, said variations being characteristics of the interaction between the two waves and representing the product thereof.

For a better understanding of the present invention and to show how the same may be carried into effect, reference will be made to the following description and to the attached drawings.

Figure 1:
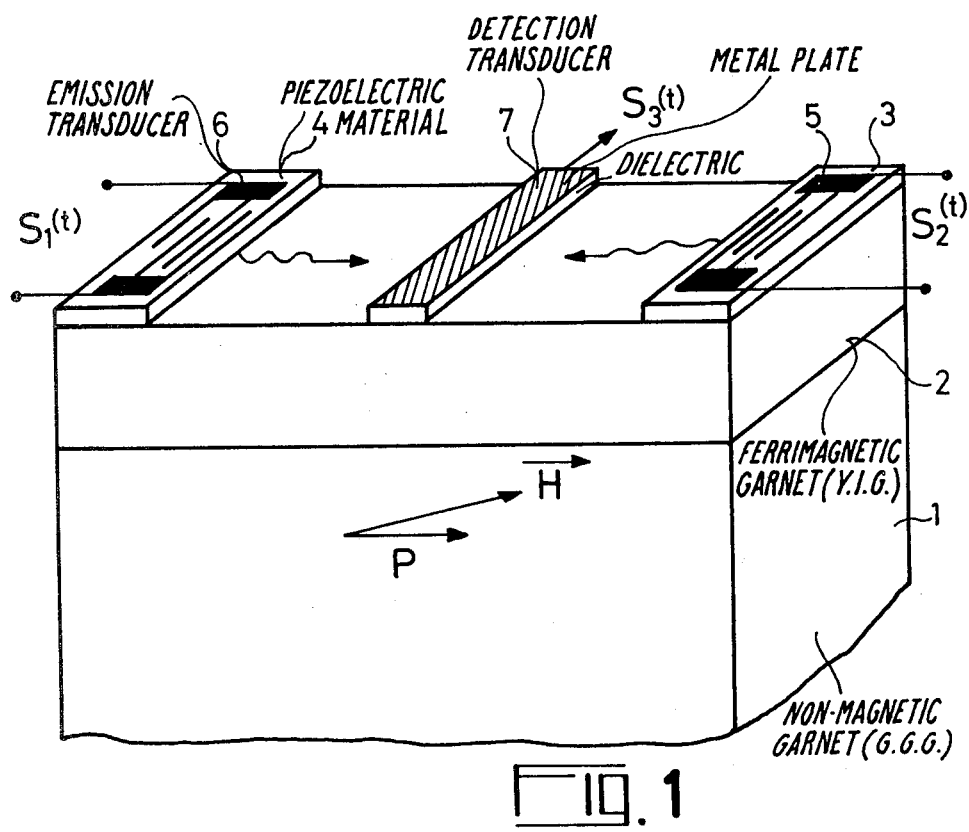
FIG. 1 shows a magnetoelastic surface wave interaction device according to the invention.

The magnetoelastic surface wave interaction device for forming the product of convolution of two electrical signals illustrated in FIG. 1 comprises a non-magnetic substrate 1, for example a non-magnetic garnet of gallium and gadolinium (G.G.G.). A ferrimagnetic garnet 2, obtained for example by epitaxial growth in the liquid or gas phase on the gallium-gadolinium garnet, forms a thin layer for the propagation of the magnetoelastic waves. This ferrimagnetic garnet may be a pure yttrium-iron garnet (Y.I.G) or a garnet doped for example with gallium and gadolinium. The thickness of this thin layer may vary for example between a few micrometers and approximately 30 micrometers.

A piezoelectric material, for example zinc oxide, is then deposited on the ferrimagnetic garnet, the deposit thus formed advantageously being limited to two zones 3 and 4 corresponding to the ends of the substrate intended to support the emitting transducers. The emitting transducers are interdigital combs 5 and 6, to the terminals of which the signals $S_1$ and $S_2$ to be treated are applied. A detecting transducer 7, which may with advantage be a ribbon guide formed by a detection plate of conductive metal, for example copper or gold, deposited on a dielectric, for example alumina, is placed in the vicinity of the thin ferrimagnetic layer 2. The structure as a whole is subjected to a magnetic field $\vec{H}$ of which the intensity is generally below 100 Oersteds and of which the direction is selected for the interaction effects to be considerable. Examples of orientation of the magnetic field in relation to the axes of the thin magnetic layer will be given hereinafter. The interaction device shown in FIG. 1 is adapted to the convolution, the useful signal being directly obtained at the exit of the ribbon guide.

The convoluter operates as follows:

The electrical signals applied to the terminals of the two interdigital combs 5 and 6 each create an elastic surface wave of the Rayleigh wave type by piezoelectric effect. These two waves are propagated in opposite directions at the surface of the magnetic material 2. Since the structure as a whole is subjected to a magnetic field and since the magnetic layer is a thin layer, the magnetic field within the layer is substantially uniform in the propagation direction and, more particularly, in the interaction zone, the effects of the demagnetizing field being confined to the ends of the plate. This magnetic control field is selected in dependence upon the frequency of the signals applied for the uniform field in the layer to induce magnetoelastic effects. The elastic deformations due to the two oppositely directed elastic waves combine with one another at a point of the layer and create a local variation in the magnetic field. The variations in the intensity of the magnetizing field are proportional to the elastic deformations, but since the layer is ferrimagnetic the corresponding variations in magnetization are characteristic of the interaction between the two elastic waves and, hence, between the two signals to be treated. This magnetization is detected by the plate 7 of conductive metal. The position of this plate is vertically adjustable.

A device of the type illustrated has been constructed around a GGG substrate one inch (25.4. mm) in diameter, on which a 25 μm thick ferrimagnetic garnet (Y.I.G.) was grown by liquid-phase epitaxy. This garnet was doped with gallium and gadolinium. Although doping of this type is not essential to the operation of the device, it does enable a low-frequency magnetoelastic interaction to be obtained in a uniform magnetization layer. These layers are known magnetically as easy-plane layers, the stable magnetization positions being situated in the plane or in a direction close to the plane. This is because the substitutions made during doping in a crystalline mesh give rise to variations in the dimensions of the mesh which are reflected in variations in the stable directions of the magnetization.

To obtain strong interactions, the propagation direction P and the direction of the magnetic field $\vec{H}$ have to be suitable selected in relation to the magnetic layer. The propagation direction may be selected for example in an easy-plane layer having an orientation <1, 1, 1>, along the axes <1, 1, 2> or <1, 1, 0> with a magnetic field oriented at 30° relative to this propagation direction.

The minimum excitation frequency of a structure such as this is of the order of 100 MHz. The thickness of the piezoelectric material and the thickness of the garnet have to be selected in dependence upon the excitation frequency to ensure that the elastic deformations remain limited to the thickness of the ferrimagnetic garnet so as to obtain a maximum interaction. For an excitation signal having a frequency of 200 MHz, the wavelength being equal to 16 μm, the thickness of the garnet has to be at least 16 μm. A 2 μm thick deposit of zinc oxide and a 25 μm thick ferrimagnetic garnet have given good results.

In FIG. 1, the structure has been shown with a piezoelectric layer limited to the ends of the substrate, as described above, so as to reduce the propagation losses and to eliminate troublesome signals due to a guided propagation in an uninterrupted piezoelectric layer. However, this construction is by no means limitative and the device may operate with an uninterrupted layer.

Figure 2:
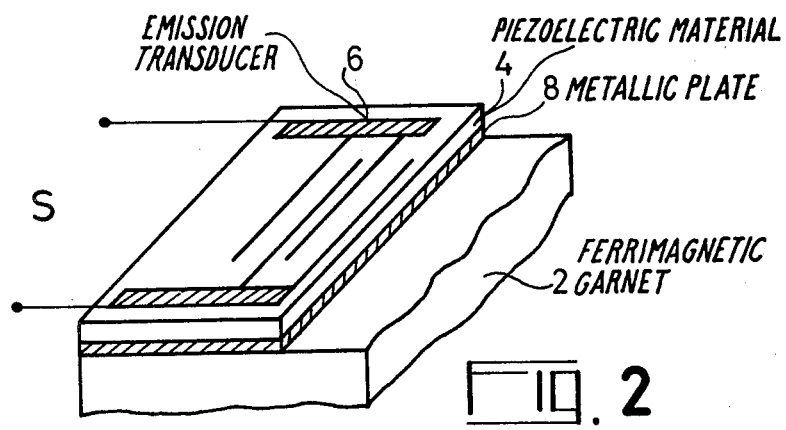
FIGS. 2 and 3 show devices for exciting the interaction device according to the invention.
Figure 3:
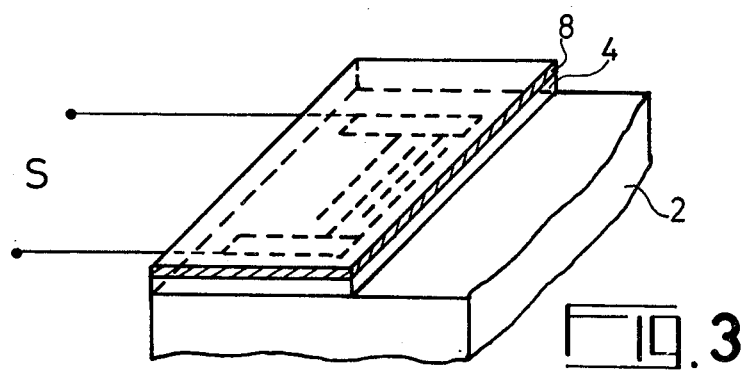

The material may be excited in several ways. FIGS. 2 and 3 show other means of exciting the material. In FIG. 2, which shows part of the end of an interaction device according to the invention, a metallic plate 8 has been placed between the layer 4 of zinc oxide and the ferrimagnetic garnet 2, the excitation transducer 6 being placed as before at the surface of the zinc oxide layer.

FIG. 3 shows one end of an interaction device according to the invention in which the excitation transducer 6 is placed between the ferrimagnetic garnet 2 and the zinc oxide layer 4, a metallic plate 8 being placed on the zinc oxide layer 4. It is also possible to obtain the electric-elastic interaction, by piezoelectric effect, by placing the excitation transducer 6 between the zinc oxide layer 4 and the ferrimagnetic garnet 2, as in FIG. 3, but without the metallic plate on the outside. The metallic plate is useful for obtaining a more effective transduction in certain cases, excitation structures of this type enabling the losses encountered during the electric-elastic conversion to be reduced. Since the ends of the substrate are used for excitation, the useful propagation length in the thin ferrimagnetic layer is of the order of 12 mm for a substrate 1 inch in diameter. The useful interaction length may be of the order of the useful propagation length by shielding the excitation transducers so that the interaction is not affected by the radiation of the transducers. The size of the receiving transducer in the propagation direction is thus of the order of 1 millimeter. For example, a 0.56 mm wide ribbon enables a 0.6 μs pulse to be collected, taking into account the fact that the interaction length of the ribbon is slightly greater than its actual length because it is the magnetic effect which is picked up, in addition to which the ribbon is not in direct contact with the garnet, but is at a variable distance therefrom, for example between 0 and 200 μm.

It should be noted that, with wider ribbons, matching problems have to be overcome to obtain a high degree of efficiency.

It is possible to characterize the efficiency of a device of the type in question by a total bilinearity factor $F_T$ such that:

$F_T = P_3/(P_1 \cdot P_2)$, $P_1$ and $P_2$ being the electrical power at the input of each of the emitting transducers at the frequency f and $P_3$ being the electrical output of the detection transducer. For a conventional convolution device of the piezoelectric type using a substrate of lithium niobate, $F_T$ is of the order of −83 dBm in the absence of a semiconductor. In the presence of a semiconductor, $F_T$ is of the order of −60 dBm. A magnetoelastic convolution device using a solid magnetic substrate leads to a bilinearity factor of the order of −90 dBm. By contrast, a convolution device according to the invention gives a bilinearity factor of the order of −35 dBm which characterizes a distinctly higher efficiency in relation to conventional devices.

The invention is by no means limited to the embodiment described and illustrated. In particular, with regard to the doping of the ferrimagnetic layer required to obtain an easy-plane magnetic layer, a structure of the type in question enables interactions to be obtained with a saturation magnetization, even at relatively low frequencies of the order of 100 MHz, these interactions being effectively reproducible. Although good results are also obtained with an undoped ferrimagnetic layer of Y.I.G., the effects are slightly less reproducible. It is also possible to dope the Y.I.G. with other substances, for example with terbium, to increase the magnetostrictive effects.

What I claim is:

1. A magnetoelastic surface wave interaction device between first and second electrical signals to be treated simultaneously, comprising a non-magnetic substrate covered with a magnetic layer having two ends, this layer being magnetically polarised, two emission transducers having inputs to receive said first and second signals, and said respective transducers being arranged on said two ends for exciting said magnetic layer, each being intended to emit a magnetoelastic surface wave, said waves being contrapropagated along a common direction in the magnetic layer, and at least one detection transducer intended to detect variations in magnetic field in the vicinity of the surface of said magnetic layer, said variations being characteristics of the interaction between the two waves and representing the product thereof.

2. A magnetoelastic surface wave interaction device as claimed in claim 1, wherein said layer is a ferrimagnetic garnet.

3. A magnetoelastic surface wave interaction device as claimed in claim 2, wherein said substrate is a non-magnetic garnet of gallium and gadolinium (G.G.G.), said ferrimagnetic layer being a garnet of yttrium and iron (Y.I.G) obtained by epitaxial growth on said substrate.

4. A magnetoelastic surface wave interaction device as claimed in claim 3, said yttrium-iron garnet is pure.

5. A magnetoelastic surface wave interaction device as claimed in claim 3, wherein said yttrium-iron garnet is doped in such a way that said magnetic layer formed is an easy plane layer.

6. A magnetoelastic surface wave interaction device as claimed in claim 1, intended to form the convolution product between said first and second signals, wherein said detection transducer is situated along the interaction zone of said two contrapropagated magnetoelastic waves, said detection transducer having a length in the propagation direction determined by the interaction length in said magnetic layer.

7. A magnetoelastic surface wave interaction device as claimed in claim 5, wherein said easy plane having an orientation $<1, 1, 1>$, said magnetic field has a direction selected among the $<1, 1, 2>$ and $<1, 1, 0>$ directions of the magnetic layer.

8. A magnetoelastic surface wave interaction device as claimed in claim 7, wherein the propagation direction of said magnetoelastic waves in the magnetic layer is one of the directions $<1, 1, 2>$ and $<1, 1, 0>$ of said magnetic layer.

9. A magnetoelastic surface wave interaction device as claimed in claim 1, wherein said emission transducers for exciting the magnetic layer each comprise a piezoelectric layer, two interdigital combs arranged in contact with one face of the piezoelectric layer, each of said signals to be treated being applied between the two combs of the corresponding excitation transducer, to create elastic deformations in said piezoelectric layer transmitted to the underlying magnetic layer.

10. A magnetoelastic surface wave interaction device as claimed in claim 9, wherein a metallic plate is placed in contact with the piezoelectric layer on a face opposite said face on which the interdigital combs are arranged.

11. A magnetoelastic surface wave interaction device as claimed in claim 6, wherein said detection transducer comprises a dielectric layer of predetermined thickness disposed on the surface of said layer in said interaction zone, and a conductive plate deposited on said dielectric layer.

* * * * *